United States Patent
Rong et al.

(10) Patent No.: US 11,063,239 B2
(45) Date of Patent: Jul. 13, 2021

(54) BARRIER FILM LAMINATE FOR A TOUCH-SENSING DISPLAY, METHOD OF MANUFACTURE, AND DISPLAYS COMPRISING THE BARRIER FILM LAMINATE

(71) Applicant: SABIC Global Technologies, B.V., Bergen op Zoom (NL)

(72) Inventors: Zhuxia Rong, Shanghai (CN); Zhe Chen, Shanghai (CN)

(73) Assignee: SHPP GLOBAL TECHNOLOGIES B.V., Bergen op Zoom (NL)

(*) Notice: Subject to any disclaimer, the term of this patent is extended or adjusted under 35 U.S.C. 154(b) by 356 days.

(21) Appl. No.: 16/076,438

(22) PCT Filed: Feb. 14, 2017

(86) PCT No.: PCT/IB2017/050830
§ 371 (c)(1),
(2) Date: Aug. 8, 2018

(87) PCT Pub. No.: WO2017/141163
PCT Pub. Date: Aug. 24, 2017

(65) Prior Publication Data
US 2020/0381656 A1    Dec. 3, 2020

Related U.S. Application Data

(60) Provisional application No. 62/295,742, filed on Feb. 16, 2016.

(51) Int. Cl.
G06F 3/044    (2006.01)
H01L 51/52    (2006.01)
(Continued)

(52) U.S. Cl.
CPC .......... H01L 51/5253 (2013.01); G06F 3/044 (2013.01); H01L 27/323 (2013.01);
(Continued)

(58) Field of Classification Search
CPC ............. H01L 51/5253; H01L 51/0097; H01L 51/5281; H01L 51/56; H01L 27/323;
(Continued)

(56) References Cited

U.S. PATENT DOCUMENTS 9,606,264 B1* 3/2017 Menon ..................... G02B 1/14
2012/0273976 A1 11/2012 David et al.
2015/0004382 A1 1/2015 Menon et al.

FOREIGN PATENT DOCUMENTS

EP    1544251 A1    6/2005

OTHER PUBLICATIONS

International Search Report for International Application No. PCT/IB2017/050830; International Filing Date: Feb. 14, 2017; dated Jun. 23, 2017; 6 pages.
(Continued)

*Primary Examiner* — Lisa S Landis
(74) *Attorney, Agent, or Firm* — Cantor Colburn LLP (57) ABSTRACT

A barrier film laminate for a touch-sensing display includes a barrier layer, an optically clear adhesive layer, an optically clear polymer film, and a touch-sensing layer. The optically clear adhesive is disposed on a first surface of the barrier layer, and the optically clear polymer film is disposed on the adhesive layer on a side opposite the glass layer. The touch-sensing layer is disposed on the polymer film on a side opposite the adhesive layer. A method for the manufacture of the barrier film laminates is also described. The barrier film laminates can be particularly useful as a component in a touch-sensing display.

15 Claims, 1 Drawing Sheet

(51) Int. Cl.
*H01L 27/32* (2006.01)
*H01L 51/00* (2006.01)
*H01L 51/56* (2006.01)

(52) U.S. Cl.
CPC ...... *H01L 27/3244* (2013.01); *H01L 51/0097* (2013.01); *H01L 51/5281* (2013.01); *H01L 51/56* (2013.01); *G06F 2203/04102* (2013.01); *G06F 2203/04103* (2013.01); *H01L 2251/5338* (2013.01)

(58) Field of Classification Search
CPC ................ H01L 27/3244; G06F 3/044; G06F 2203/04102; G06F 2203/04103
See application file for complete search history.

(56) References Cited

OTHER PUBLICATIONS

Written Opinion of the International Searching Authority for International Application No. PCT/IB2017/050830; International Filing Date: Feb. 14, 2017; dated Jun. 23, 2017; 8 pages.

* cited by examiner

BARRIER FILM LAMINATE FOR A TOUCH-SENSING DISPLAY, METHOD OF MANUFACTURE, AND DISPLAYS COMPRISING THE BARRIER FILM LAMINATE

CROSS-REFERENCE TO RELATED APPLICATIONS

This application is a National Stage application of PCT/IB2017/050830, filed Feb. 14, 2017, which claims the benefit of U.S. Provisional Application No. 62/295,742, filed Feb. 16, 2016, both of which are incorporated by reference herein in their entirety.

BACKGROUND

Touch-control electronic devices have been the subject of extensive research and development, as such devices are not only space-saving and easy to carry, but also are operable directly by a user through a finger, a stylus or the like, comfortable to use, and very convenient. For example, personal digital assistants (PDAs), touch-control cell phones, portable notebook computers, and the like common in the market at present are of interest for use with touch control technology.

The display mode of an organic light emitting diode (OLED) display screen differs from the display mode of a conventional LCD (liquid crystal display) in that it does not need a backlight source, and an OLED is formed through ultra-thin coating layers of organic materials and a glass substrate. These organic materials can emit light when a current passes through them. Furthermore, an OLED has a low voltage requirement, and it is of energy saving and high efficiency. Because of fast response, light weight, small thickness, simple construction, low cost and other merits, OLEDs are regarded as promising products for advancing display technologies.

The combination of the touch control technology and OLED technology can further the development of display technology. For the touch structures of organic light emitting diode display devices at present, a touch screen and a display portion of an organic light emitting diode display device are mostly manufactured separately. This configuration increases the weight and thickness of a display itself, and is contrary to the advantages of the organic light emitting diode display device itself, namely its light-weight, slim profile.

A further obstacle for the exploitation of OLEDs for use with touch-control electronic devices is the deterioration of such devices under normal environmental conditions. In particular the exposure to oxygen and moisture contribute to a decline of the functional properties on a time-scale that is not acceptable for potential users of such devices. The relatively fast deterioration of organic electronic devices represents a significant hurdle that must be overcome, despite the advantages that such devices have compared to silicon-based electronics. To slow down the deterioration of the devices, the devices are often encapsulated by a material that is a good barrier for vapors and gasses, in particular for moisture and oxygen.

Devices on a non-flexible substrate can be encapsulated by for example a metallic cap. A disadvantage of a metallic cap is that it is neither flexible nor optically transparent. For the encapsulation of flexible devices, barrier laminates are applied. Barrier laminates are stacks of at least two planar layers. Barrier laminates that have been explored for encapsulation include inorganic/organic hybrid materials. However, incorporation of such layers can lead to an overall increase in device thickness due to the presence of additional layers (e.g., to render the device touch responsive).

Accordingly, there remains a continuing need in the art for an improved barrier film laminate to protect a display from undesirable deterioration due to exposure to environmental factors. It would be particularly advantageous to provide a touch-sensing display having a reduced number of layers, resulting in a thinner and lighter design.

BRIEF DESCRIPTION

A barrier film laminate a touch-sensing display comprises a barrier layer having a first surface and a second surface opposite the first surface; an optically clear adhesive layer disposed on the first surface of the barrier layer, wherein a 50 micrometer-thick sample of the optically clear adhesive transmits greater than 85% of visible light as determined according to ASTM D1003-00; an optically clear polymer film disposed on the optically clear adhesive on a side opposite the barrier layer, the polymer film comprising a thermoplastic polymer, wherein a 100 micrometer-thick sample of the optically clear polymer film transmits greater than 85% of visible light as determined according to ASTM D1003-00; and a touch-sensing layer disposed on the polymer film on a side opposite the optically clear adhesive layer, wherein a 5 micrometer-thick sample of the touch-sensing layer transmits greater than 80% of visible light as determined according to ASTM D1003-00.

A method for the manufacture of the barrier film laminate comprises applying the touch-sensing layer to the polymer film; applying the optically clear adhesive to at least a portion of the first surface of the barrier layer; and applying the polymer film to the optically clear adhesive on a side opposite the touch-sensing layer.

A touch sensing display comprises the barrier film laminate.

The above described and other features are exemplified by the following figures and detailed description.

BRIEF DESCRIPTION OF THE DRAWINGS

The following figures are exemplary embodiments wherein the like elements are numbered alike.

DETAILED DESCRIPTION

The present inventors have discovered a barrier film laminate for use with a touch-sensing display having a layered laminate structure, preferably a glass/plastic laminated structure. Advantageously, the barrier film laminate integrates a touch-sensing layer into the laminate, providing a simplified assembly process for flexible touch display production. Thus the barrier film laminate can be particularly useful as a component in a touch-sensing display. Furthermore, the barrier film laminate is flexible, transparent, and can provide exceptional resistance to gas and water vapor permeation, thus preserving the lifetime of the display device.

Accordingly, one aspect of the present disclosure is a barrier film laminate. As used herein, the term "barrier film laminate" refers to a laminate that functions as a barrier against environmental factors such as moisture. The word "film" refers to the fact that the laminate is thin in comparison to the other dimensions of the laminate. The film laminate can be a free standing laminate or a laminate that is deposited on a carrier such as a substrate or a device, for example an organic electronic device.

Figure 1:
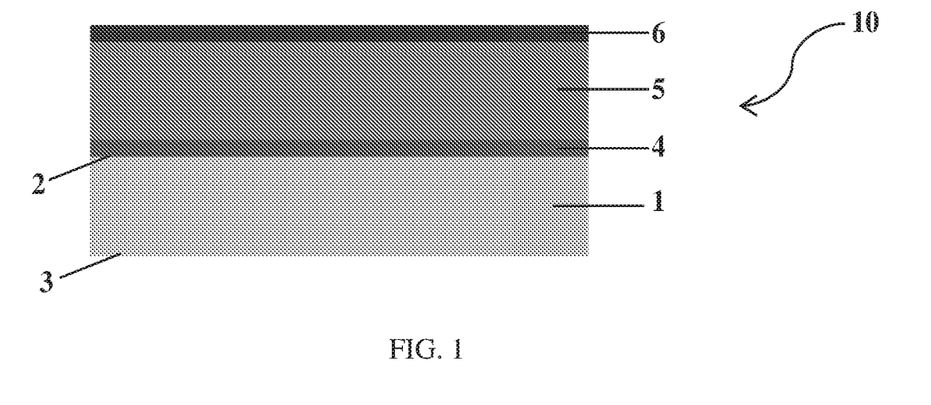
FIG. 1 is a schematic illustration of a cross sectional view of a barrier film laminate.

The barrier film laminate can be as shown in FIG. 1. As shown in FIG. 1, the barrier film laminate (10) includes a barrier layer (1) having a first surface (2) and a second surface (3) opposite the first surface; an optically clear adhesive layer (4) disposed on the first surface of the barrier layer, wherein a 50 micrometer-thick sample of the optically clear adhesive transmits greater than 85% of visible light as determined according to ASTM D1003-00; an optically clear polymer film (5) disposed on the optically clear adhesive on a side opposite the barrier layer, the polymer film comprising a thermoplastic polymer, wherein a 100 micrometer-thick sample of the optically clear polymer film transmits greater than 85% of visible light as determined according to ASTM D1003-00; and a touch-sensing layer (6) disposed on the polymer film on a side opposite the optically clear adhesive layer, wherein a 5 micrometer-thick sample of the touch-sensing layer transmits greater than 80% of visible light as determined according to ASTM D1003-00.

The barrier layer provides physical protection, and preferably can further provide protection from moisture or oxygen or both. In some embodiments, the barrier layer can be a glass layer, preferably a flexible glass layer. The glass layer can be, but is not limited to, chemically strengthened glass (e.g., CORNING™ GORILLA™ Glass commercially available from Corning Inc., XENSATION™ glass commercially available from Schott AG, DRAGONTRAIL™ glass commercially available from Asahi Glass Company, LTD, and CX-01 glass commercially available from Nippon Electric Glass Company, LTD, and the like), non-strengthened glass such as non-hardened glass including low sodium glass (e.g., CORNING™ WILLOW™ Glass commercially available from Corning Inc. and OA-10G Glass-on-Roll glass commercially available from Nippon Electric Glass Company, LTD, and the like), tempered glass, or optically transparent synthetic crystal (also referred to as sapphire glass, commercially available from GT Advanced Technologies Inc.).

In other embodiments, the barrier layer can be a barrier film comprising two or more thin films comprising different materials. In some embodiments a set of materials (e.g, a pair of films, or a set of three or more films) is layered in an alternating structure of two, three, four, or more pairs or sets. A wide variety of different film materials can be used to provide the desired barrier properties. For example, a pair of layers can include a layer of an organic material, e.g, a polymer, and an inorganic material, e.g., silica, alumina, or a glass; or a layer of a first inorganic material and a layer of a second inorganic material, e.g., a silica layer and a glass layer; or a layer including nanoparticles, and a layer of an inorganic material such as silica. The organic materials can include those used in the optically clear polymer films described below, and can be selected for their high temperature resistance, gas barrier properties, or both. Preferred materials for the organic layer of the barrier film include polyethylene naphthalate, polyether ether ketone, polyether sulfone, polystyrenes, or a combination comprising at least one of the foregoing. Materials for the inorganic layer of the barrier films are similarly selected. Examples of inorganic materials that can be used include individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations comprising at least one of the foregoing, provided that an optically clear barrier film layer can be manufactured.

The barrier films can be formed by known processes, for example liquid coating techniques such as solution coating, roll coating, dip coating, spray coating, or spin coating; coating techniques such as sputtering, vacuum processes for thermal evaporation and deposition of solid materials, chemical vapor deposition (CVD), chemical vapor deposition (PECVD) or atomic layer deposition (ALD). In some embodiments, the barrier film can be prepared using ALD. In some embodiments, suitable barrier films can be Ultra Barrier Films available from LOTUS Applied Technology.

The barrier layer can have a thickness of 50 micrometers to 1 millimeter, preferably 50 micrometers to 0.7 millimeter, more preferably 50 to 400 micrometers, even more preferably 50 to 200 micrometers.

In addition to the barrier layer, the cover assembly comprises a first optically clear adhesive layer disposed on at least a portion of the first surface of the barrier layer. In some embodiments, the optically clear adhesive layer is in adhesive contact with the entire first surface of the barrier layer. As used herein, the term "optically clear adhesive" means that a 50 micrometer-thick sample of the optically clear adhesive transmits greater than 85% of visible light as determined according to ASTM D1003-00. The first optically clear adhesive layer can have a thickness of 1 to 2000 micrometers, or 1 to 1000 micrometers, or 1 to 500 micrometers, or 1 to 100 micrometers, or 10 to 100 micrometers, or 10 to 50 micrometers, or 12.5 to 25 micrometers.

The adhesive can include epoxy, acrylate, amine, urethane, silicone, thermoplastic urethane, ethyl vinyl acetate, hindered amine light stabilizer free ethyl vinyl acetate (HALS free EVA), or a combination comprising at least one of the foregoing. In an embodiment, the adhesive is a hindered amine light stabilizer free ethyl vinyl acetate (HALS free EVA). In an embodiment the adhesive is a thermoplastic urethane, or an ultra violet light cured modified acrylate optical quality adhesive, or a silicone pressure sensitive adhesive, or an acrylate pressure sensitive adhesive. The adhesive can be applied using a process such as roll lamination, roller coating, screen printing, spreading, spray coating, spin coating, dip coating, and the like, or a combination comprising at least one of the foregoing techniques.

In addition to the barrier layer and the first optically clear adhesive layer, the cover assembly further includes an optically clear polymer film. The optically clear polymer film is disposed on the optically clear adhesive on a side opposite the barrier layer. Stated another way, the first optically clear adhesive is sandwiched between the optically clear polymer film and the first surface of the barrier layer (as shown in FIG. 1). As used herein, the term "optically clear polymer film" means that a 100 micrometer-thick sample of the optically clear polymer film transmits greater than 85% of visible light as determined according to ASTM D1003-00. In some embodiments, the optically clear polymer film can have a thickness of 1 micrometer to 10 millimeters, preferably 5 micrometers to 10 millimeters, more preferably 5 micrometers to 1 millimeter, even more preferably 5 to 250 micrometers, even more preferably still 5 to 100 micrometers.

The optically clear polymer film comprises a thermoplastic polymer, a thermoset polymer, or a combination comprising at least one of the foregoing. In some embodiments, the polymer film comprises a thermoplastic polymer. As used herein, the term "thermoplastic" refers to a material that is plastic or deformable, melts to a liquid when heated, and freezes to a brittle, glassy state when cooled sufficiently. Examples of thermoplastic polymers that can be used include polyacetals (e.g., polyoxyethylene and polyoxymethylene), poly($C_{1-6}$ alkyl)acrylates, polyacrylamides (including unsubstituted and mono-N— and di-N—($C_{1-8}$ alkyl) acrylamides), polyamides (e.g., aliphatic polyamides, polyphthalamides, and polyaramides), polyamideimides, polyanhydrides, polyarylene ethers (e.g., polyphenylene ethers), poly(arylene ketones) (e.g., polyetheretherketones (PEEK), polyetherketoneketones (PEKK), polyetherketones (PEK), and the like), polyarylene sulfides (e.g., polyphenylene sulfides (PPS)), polyarylene sulfones (e.g., polyethersulfones (PES), polyphenylene sulfones (PPS), and the like), polybenzothiazoles, polybenzoxazoles, polybenzimidazoles, polycarbonates (including homopolycarbonates and polycarbonate copolymers such as polycarbonate-siloxanes, polycarbonate-esters, and polycarbonate-ester-siloxanes), polyesters (e.g., polyethylene terephthalates (PET), polybutylene terephthalates (PBT), polyarylates, and polyester copolymers such as polyester-ethers), polyetherimides (including copolymers such as polyetherimide-siloxane copolymers), polyimides (including copolymers such as polyimide-siloxane copolymers), poly($C_{1-6}$ alkyl)methacrylates, polymethacrylamides (including unsubstituted and mono-N— and di-N—($C_{1-8}$ alkyl)acrylamides), cyclic olefin polymers (including polynorbornenes and copolymers containing norbornenyl units, for example copolymers of a cyclic polymer such as norbornene and an acyclic olefin such as ethylene or propylene), polyolefins (e.g., polyethylenes, polypropylenes, and their halogenated derivatives (such as polytetrafluoroethylenes), and their copolymers, for example ethylene-alpha-olefin copolymers, polyoxadiazoles, polyoxymethylenes, polyphthalides, polysilazanes, polysiloxanes (silicones), polystyrenes (including copolymers such as acrylonitrile-butadiene-styrene (ABS) and methyl methacrylate-butadiene-styrene (MBS)), polysulfides, polysulfonamides, polysulfonates, polysulfones, polythioesters, polytriazines, polyureas, polyurethanes, polyvinyl alcohols, polyvinyl esters, polyvinyl ethers, polyvinyl halides, polyvinyl nitriles, polyvinyl ketones, polyvinyl thioethers, polyvinylidene fluorides, or the like. A combination comprising at least one of the foregoing thermoplastic polymers can be used.

The thermoplastic polymers can have a weight average molecular weight (Mw) of about 1,000 to about 200,000 g/mol, or about 1,000 to about 10,000 g/mol. The thermoplastic polymers can have a melt flow of 1 g/10 minutes or higher, preferably 10 g/10 minutes or higher, up to 7,500 g/10 minutes, each determined according to ASTM D 1283 at 316° C. under a 5 kg load, and in another embodiment greater than about 50 g/10 minutes.

In some embodiments, the optically clear polymer film can include a polycarbonate. "Polycarbonate" as used herein means a homopolymer or copolymer having repeating structural carbonate units of formula (1)

(1)

wherein at least 60 percent of the total number of $R^1$ groups are aromatic, or each $R^1$ contains at least one $C_{6-30}$ aromatic group. Polycarbonates and their methods of manufacture are known in the art, being described, for example, in WO 2013/175448 A1, US 2014/0295363, and WO 2014/072923. Polycarbonates are generally manufactured from bisphenol compounds such as 2,2-bis(4-hydroxyphenyl) propane ("bisphenol-A" or "BPA"), 3,3-bis(4-hydroxyphenyl) phthalimidine, (also known as N-phenyl phenolphthalein bisphenol, "PPPBP", or 3,3-bis(4-hydroxyphenyl)-2-phenylisoindolin-1-one), 1,1-bis(4-hydroxy-3-methylphenyl)cyclohexane ("DMB"), or 1,1-bis(4-hydroxy-3-methylphenyl)-3,3,5-trimethylcyclohexane ("isophorone bisphenol"), or a combination comprising at least one of the foregoing bisphenol compounds can also be used. In a specific embodiment, the polycarbonate is a homopolymer derived from BPA; a copolymer derived from BPA and another bisphenol or dihydroxy aromatic compound such as resorcinol; or a copolymer derived from BPA and optionally another bisphenol or dihydroxyaromatic compound, and further comprising non-carbonate units, for example aromatic ester units such as resorcinol terephthalate or isophthalate, aromatic-aliphatic ester units based on $C_{6-20}$ aliphatic diacids, polysiloxane units such as polydimethylsiloxane units, or a combination comprising at least one of the foregoing. In a specific embodiment, the polycarbonate is a linear homopolymer containing bisphenol A carbonate units (BPA-PC), commercially available under the trade name LEXAN from SABIC; or a branched, cyanophenol end-capped bisphenol A homopolycarbonate produced via interfacial polymerization, containing 3 mol % 1,1,1-tris(4-hydroxyphenyl)ethane (THPE) branching agent, commercially available under the trade name LEXAN CFR from SABIC. A combination of a linear polycarbonate and a branched polycarbonate can be used. It is also possible to use a polycarbonate copolymer or interpolymer rather than a homopolymer. Polycarbonate copolymers can include copolycarbonates comprising two or more different types of carbonate units, for example units derived from BPA and PPPBP (commercially available under the trade name XHT from SABIC); BPA and DMBPC (commercially available under the trade name DMX from SABIC); or BPA and isophorone bisphenol (commercially available under the trade name APEC from Bayer). The polycarbonate copolymers can further comprise non-carbonate repeating units, for example repeating ester units (polyester-carbonates), such as those comprising resorcinol isophthalate and terephthalate units and bisphenol A carbonate units, such as those commercially available under the trade name LEXAN SLX from SABIC; bisphenol A carbonate units and isophthalate-terephthalate-bisphenol A ester units, also commonly referred to as poly(carbonate-ester)s (PCE) or poly(phthalate-carbonate)s (PPC), depending on the relative ratio of carbonate units and ester units; or bisphenol A carbonate units and $C_{6-12}$ dicarboxy ester units such as sebacic ester units (commercially available under the trade name HFD from SABIC) Other polycarbonate copolymers can comprise repeating siloxane units (polycarbonate-siloxanes), for example those comprising bisphenol A carbonate units and siloxane units (e.g., blocks containing 5 to 200 dimethylsiloxane units), such as those commercially available under the trade name EXL from SABIC; or both ester units and siloxane units (polycarbonate-ester-siloxanes), for example those comprising bisphenol A carbonate units, isophthalate-terephthalate-bisphenol A ester units, and siloxane units (e.g., blocks containing 5 to 200 dimethylsiloxane units), such as those commercially available under the trade name FST from SABIC. Combinations of any of the above materials can be used.

Combinations of polycarbonates with other polymers can be used, for example a combination (preferably an alloy) of bisphenol A polycarbonate with an ester such as poly(butylene terephthalate) or poly(ethylene terephthalate), each of which can be semicrystalline or amorphous. Such combinations are commercially available under the trade name XENOY and XYLEX from SABIC.

A specific copolycarbonate includes bisphenol A and bulky bisphenol carbonate units, i.e., derived from bisphenols containing at least 12 carbon atoms, for example 12 to 60 carbon atoms or 20 to 40 carbon atoms. These polycarbonates have high melting points, good chemical resistance, and good scratch resistance. Examples of such copolycarbonates include BPA-PPPBP copolymers such as LEXAN XHT from SABIC), BPA-DMBPC copolymers such as LEXAN DMC from SABIC, or a copolymer comprising bisphenol A carbonate units and isophorone bisphenol carbonate units (commercially available under the trade name APEC from Bayer) as described above.

The polycarbonates can have an intrinsic viscosity, as determined in chloroform at 25° C., of 0.3 to 1.5 deciliters per gram (dl/gm), specifically 0.45 to 1.0 dl/gm. The polycarbonates can have a weight average molecular weight of 10,000 to 200,000 Daltons, specifically 20,000 to 100,000 Daltons, as measured by gel permeation chromatography (GPC), using a crosslinked styrene-divinylbenzene column and calibrated to polycarbonate references. GPC samples are prepared at a concentration of 1 milligram per milliliter, and are eluted at a flow rate of 1.5 milliliter per minute.

In some embodiments, the optically clear polymer film can include a polyester as described above. Specific polyesters include PET, PBT, a glycol-modified poly(ethylene terephthalate), poly(ethylene naphthalate) (PEN), poly(1,4-cyclohexane-dimethanol-1,4-cyclohexane dicarboxylate) (PCCD), poly(cyclohexanedimethylene terephthalate)-co-poly(ethylene terephthalate), or a combination comprising at least one of the foregoing polyesters.

In some embodiments, the optically clear polymer film can include a cyclic olefin polymer, a polyolefin, or a combination comprising at least one of the foregoing. Representative examples of cyclic olefin polymers include polynorbornene and copolymers of norbornene and ethylene or propylene. Representative examples of polyolefins are polyethylene, polypropylene, polybutylene, polymethylpentene (and co-polymers thereof), polynorbornene (and co-polymers thereof), poly(l-butene), poly(3-methylbutene), poly(4-methylpentene) and copolymers of ethylene with alpha-olefins such as propylene, 1-butene, 1-hexene, 1-octene, 1-decene, 4-methyl-1-pentene and 1-octadecene. Representative combinations of polyolefins are combinations containing polyethylene and polypropylene, low-density polyethylene and high-density polyethylene, and polyethylene and olefin copolymers containing copolymerizable monomers, e.g., ethylene and acrylic acid copolymers; ethyl and methyl acrylate copolymers; ethylene and ethyl acrylate copolymers; ethylene and vinyl acetate copolymers, ethylene, acrylic acid, and ethyl acrylate copolymers, and ethylene, acrylic acid, and vinyl acetate copolymers. In some embodiments, the polymer film comprises polypropylene, preferably biaxially oriented polypropylene.

The barrier film laminate further comprises a touch-sensing layer. The touch-sensing layer is disposed on the polymer film on a side opposite the optically clear adhesive layer. In some embodiments, the touch-sensing layer is a capacitive touch-sensing layer. In some embodiments, the touch-sensing layer can include, but is not limited to indium tin oxide, carbon nanotubes, graphene, conductive metal nanowires, conductive metal nanoparticles, a conductive nanomesh (including a self-assembling conductive nanomesh, for example formed from conductive metal nanoparticles), a conductive polymer, or a combination comprising at least one of the foregoing. In some embodiments, the touch-sensing layer preferably comprises silver nanoparticles, silver nanowires, carbon nanotubes, graphene, a conductive polymer, or a combination comprising at least one of the foregoing. In some embodiments, the touch-sensing layer can include one or more conductive layers, one or more of which can be patterned.

Advantageously, the barrier film laminate can exhibit one or more of the following properties.

The barrier film laminate can be transparent, for example, wherein the barrier film laminate transmits greater than 85% of visible light as determined according to ASTM D1003-00. A transparent barrier laminate is in particular suited for the encapsulation of optoelectronic devices such as organic light emitting diodes (OLEDs) because such a laminate can also be applied on the light emitting side of the OLED.

In some embodiments, the barrier film laminate is flexible, preferably wherein the barrier film laminate has a flexibility of 3R or less as measured according to JIS K6902.

In some embodiments the barrier film laminate has a water vapor transmission rate of $10^{-6}$ to $10^{-3}$ grams per square meter (g/m$^2$) per day, as determined according to ASTM F1249-06.

The barrier film laminate can be prepared by a method comprising applying the touch-sensing layer to the polymer film, applying the optically clear adhesive to at least a portion of the first surface of the barrier layer and applying the polymer film to the optically clear adhesive on a side opposite the touch-sensing layer. The adhesive can be applied using any suitable process including, but not limited to, roll lamination, roller coating, screen printing, spreading, spray coating, spin coating, dip coating, and the like, or a combination comprising at least one of the foregoing techniques. The polymer film can be prepared using any method for preparing a polymer film that is generally known. For example, the polymer film can be prepared by extrusion, solution casting, melt blowing, and the like. Applying the touch-sensing layer can be by, for example, a sputtering process, a solution coating process, a physical vapor deposition process, or a chemical vapor deposition process. The layers can generally be assembled in any order to provide the desired barrier film laminate.

Figure 2:
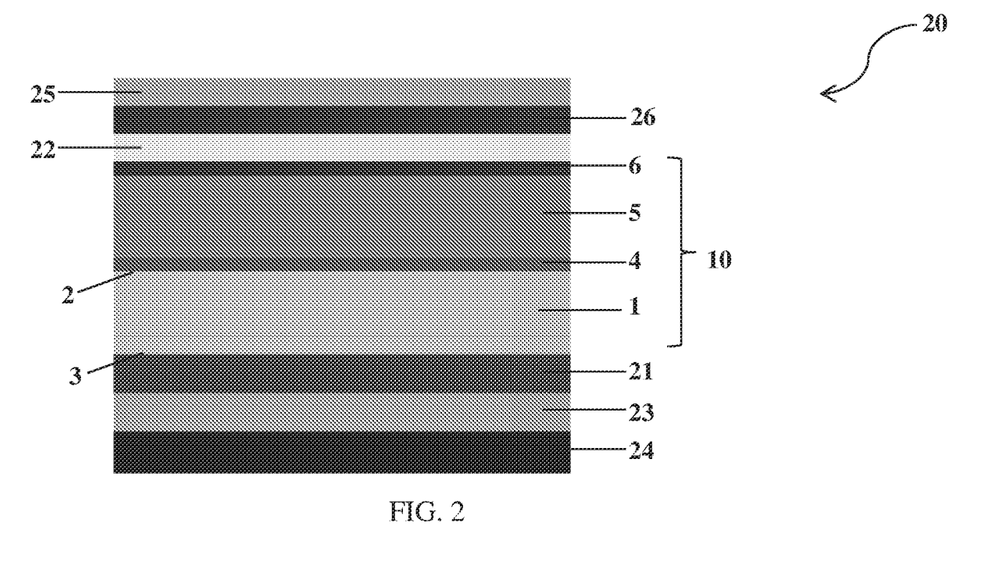
FIG. 2 is a schematic illustration of a cross sectional view of a touch-sensing display device comprising the barrier film laminate.

The barrier film laminates described herein can be particularly useful as a component of a touch-sensing display. For example, a touch-sensing display comprising the barrier film laminate can be as shown in FIG. 2. As shown in FIG. 2, the touch sensing display (20) includes the barrier film laminate (10) disposed between a light emitting layer (21) and a polarizer (22) such that the second surface of the barrier layer of the barrier film laminate is in contact with the light emitting layer and the touch-sensing layer of the barrier film laminate is in contact with the polarizer. The touch-sensing display can further include a thin film transistor (23) disposed on the light emitting layer (21), a flexible polymer-containing substrate (24) disposed on the thin film transistor (23) on a side opposite the light emitting layer, and a cover lens (25) adhered to the polarizer on a side opposite the touch-sensing barrier layer via a second optically clear adhesive layer (26).

In some embodiments, the touch-sensing display can be an organic light emitting diode display and the light emitting layer is an organic light emitting layer. In some embodiments, the organic light emitting diode comprises a first and second electrode, and an organic light emitting layer disposed between the first and second electrodes. In some embodiments, the first electrode can comprise indium tin oxide, aluminum zinc oxide, indium zinc oxide, cadmium tin oxide, gallium zinc oxide, conductive nanowires, conductive nanomesh (e.g., formed from conductive metal nanoparticles) and the like, or a combination comprising at least one of the foregoing, preferably indium tin oxide. The second electrode is preferably a reflective material, for example, titanium, tantalum, molybdenum, aluminum, neodymium, gold, silver, copper, and the like, or a combination comprising at least one of the foregoing reflective materials. The light emitting layer can be selected based on the desired color of the emitted light. The emitted color of the light generally depends on the combination of a dopant and a host material included in the light emitting layer. For example, in some embodiments, the host material in the organic light emitting layer can be tris(8-hydroxy quinoline)aluminum (III) (Alq3), and the dopant thereof can be organic material including red dopants such as 4-dicyanomethylene-2-tert-butyl-6-(1,1,7,7-tetramethyljulolidin-4-yl-vinyl)-4H-pyran (DCJTB), green dopants such as 10-(2-Benzothiazolyl)-2,3,6,7-tetrahydro-1,1,7,7-tetramethyl-1H,5H,11H-(1)benzopyrano (6,7-8-I,j)quinolizin-11-one, (C545T), or blue dopants such as 4,4'-bis(2,2'-diphenylvinyl)-1,1'-biphenyl(DPVBi) or spiro-DPVBi. In some embodiments, the host material of the organic light emitting layer can be organic molecules including anthracene series such as 2-methyl-9,10-di(2-naphthyl)anthracene (MADN) or carbazole series such as 4,4'-bis(carbazole-9-yl)-biphenyl (CBP), N,N-'-dicarbazolyl-3,5-benzene (mCP), and tris(carbazol-9-yl)benzene (tCP). The corresponding dopant of the organic host material can be a metal dopant including iridium complexes such as bis(1-phenylisoquinoline)acetylacetonate iridium (PIQIr(acac)), bis(2-phenylquinolyl-N,C2) acetylacetonate iridium (III) (PQIr(acac)), or bis(2-phenyl quinolyl-N,C2')acetylacetonate iridium(III) (PQIr), or platinum complexes such as platinum octaethylporphine (PtOEP). The iridium complex applied to emit green light may be tris[2-(2-pyridinyl)phenyl-C,N]-iridium (abbreviated Ir(ppy)$_3$). A hole injection layer, a hole transport layer, or other layers can be disposed between the organic light emitting layer and a positive electrode (e.g. the first electrode or the second electrode), and an electron injection layer, an electron transport layer, or other layers can be disposed between the organic light emitting layer and a negative electrode (e.g. the first electrode or the second electrode), respectively, to further enhance the illumination efficiency of the organic light emitting diode.

In some embodiments, the flexible polymer-containing substrate can comprise a polyimide, polyester (including copolymers thereof), polycarbonate (including copolymers thereof), polyether ether ketone, polyarylate, cycloolefin polymer, or a combination comprising at least one of the foregoing, preferably polyimide, polyethylene terephthalate, polyethylene naphthalate, polynorbornene, polyethersulfone, or a combination comprising at least one of the foregoing. In some embodiments, the flexible polymer-containing substrate can be a polyimide-containing substrate.

In some embodiments, the touch-sensing display is a curved display, a curvilinear display, a foldable display, or a flexible display.

The touch-sensing displays of the present disclosure can be useful for a variety of applications including consumer electronics, in particular in electronic display devices. Examples of electronic devices that can be utilized with the touch-sensing display including the barrier film laminate include, but are not limited to, a cellular telephone, a smart telephone, a laptop computer, a notebook computer, a tablet computer, a television, a console (e.g., an appliance console or an automotive console, particularly an automotive interior center console), an electronic reading device, a smart window, public information displays, or a wearable electronic device (e.g., smart watch, activity tracker, health tracker, health monitoring devices, and the like).

The barrier film laminates described herein include a laminated structure which advantageously integrates a touch-sensing layer into the laminate, providing a simplified assembly process for flexible touch display production. The barrier film laminates can be particularly useful as components in a touch-sensing display, particularly where flexibility, transparency, and resistance to gas and water vapor permeation are desired. Accordingly, a significant improvement in barrier film laminates for touch-sensing display devices is provided by the present disclosure The laminates, methods, and displays described herein are further illustrated by the following non-limiting embodiments.

Embodiment 1: A barrier film laminate for a touch-sensing display comprising a barrier layer having a first surface and a second surface opposite the first surface; an optically clear adhesive layer disposed on the first surface of the barrier layer, wherein a 50 micrometer-thick sample of the optically clear adhesive transmits greater than 85% of visible light as determined according to ASTM D1003-00; an optically clear polymer film disposed on the optically clear adhesive on a side opposite the barrier layer, the polymer film comprising a thermoplastic polymer, wherein a 100 micrometer-thick sample of the optically clear polymer film transmits greater than 85% of visible light as determined according to ASTM D1003-00; and a touch-sensing layer disposed on the polymer film on a side opposite the optically clear adhesive layer, wherein a 5 micrometer-thick sample of the touch-sensing layer transmits greater than 80% of visible light as determined according to ASTM D1003-00.

Embodiment 2: The barrier film laminate of embodiment 1, wherein the barrier film laminate transmits greater than 85% of visible light as determined according to ASTM D1003-00.

Embodiment 3: The barrier film laminate of embodiment 1 or 2, wherein the barrier film laminate is flexible, preferably wherein the barrier film laminate has a flexibility of 3R or less as measured according to JIS K6902.

Embodiment 4: The barrier film laminate of any one or more of embodiments 1 to 4, wherein the barrier film laminate has a water vapor transmission rate of $10^{-6}$ to $10^{-3}$ g/m$^2$ per day, as determined according to ASTM F1249-06.

Embodiment 5: The barrier film laminate of any one or more of embodiments 1 to 4, wherein the barrier layer has a thickness of 50 micrometers to 1 millimeter, preferably 50 micrometers to 0.7 millimeter, more preferably 50 to 400 micrometers, even more preferably 50 to 200 micrometers.

Embodiment 6: The barrier film laminate of any one or more of embodiments 1 to 5, wherein the barrier layer is a glass layer comprising chemically strengthened glass, non-strengthened glass, tempered glass, or optically transparent synthetic crystal.

Embodiment 7: The barrier film laminate of any one or more of embodiments 1 to 5, wherein the barrier layer is a barrier film comprising two or more thin films comprising different materials.

Embodiment 8: The barrier film laminate of any one or more of embodiments 1 to 7, wherein the optically clear adhesive layer comprises epoxy, acrylate, amine, urethane, silicone, thermoplastic urethane, ethyl vinyl acetate, hindered amine light stabilizer free ethyl vinyl acetate, or a combination comprising at least one of the foregoing.

Embodiment 9: The barrier film laminate of any one or more of embodiments 1 to 8, wherein the optically clear adhesive has a thickness of 1 to 2000 micrometers, preferably 10 to 100 micrometers, more preferably 10 to 50 micrometers, even more preferably 12.5 to 25 micrometers.

Embodiment 10: The barrier film laminate of any one or more of embodiments 1 to 9, wherein the polymer film comprises a polycarbonate, a polyester, a polyolefin, or a combination comprising at least one of the foregoing, preferably a bisphenol A polycarbonate homopolymer, a bisphenol A polycarbonate copolymer, poly(ethylene terephthalate), poly(ethylene naphthalate), polypropylene, or a combination comprising at least one of the foregoing.

Embodiment 11: The barrier film laminate of any one or more of embodiments 1 to 10, wherein the polymer film has a thickness of 1 micrometer to 10 millimeters, preferably 5 micrometers to 10 millimeters, more preferably 5 micrometers to 1 millimeter, even more preferably 5 to 250 micrometers, even more preferably still 5 to 100 micrometers.

Embodiment 12: The barrier film laminate of any one or more of embodiments 1 to 11, wherein the touch-sensing layer is a capacitive touch-sensing layer.

Embodiment 13: The barrier film laminate of any one or more of embodiments 1 to 12, wherein the touch-sensing layer comprises indium tin oxide, carbon nanotubes, graphene, conductive metal nanowires, conductive metal nanoparticles, a conductive nanomesh, a conductive polymer or a combination comprising at least one of the foregoing, preferably silver nanoparticles, silver nanowires, carbon nanotubes, graphene, a conductive polymer, or a combination comprising at least one of the foregoing.

Embodiment 14: A method of manufacturing the barrier film laminate of any one or more of embodiments 1 to 13, the method comprising, applying the touch-sensing layer to the polymer film; applying the optically clear adhesive to at least a portion of the first surface of the barrier layer; and applying the polymer film to the optically clear adhesive on a side opposite the touch-sensing layer.

Embodiment 15: A touch-sensing display comprising the barrier film laminate of any one or more of embodiments 1 to 13.

Embodiment 16: The touch-sensing display of embodiment 15, wherein the barrier film laminate is disposed between a light emitting layer and a polarizer such that the second surface of the barrier layer of the barrier film laminate is in contact with the light emitting layer and the touch-sensing layer of the barrier film laminate is in contact with the polarizer.

Embodiment 17: The touch-sensing display of embodiment 16, further comprising a thin film transistor disposed on the light emitting layer; a flexible polymer-containing substrate disposed on the thin film transistor on a side opposite the light emitting layer; and a cover lens adhered to the polarizer on a side opposite the touch-sensing barrier layer via a second optically clear adhesive layer.

Embodiment 18: The touch-sensing display of any one or more of embodiments 15 to 17, wherein the display is an organic light emitting diode display and the light emitting layer is an organic light emitting layer.

Embodiment 19: The touch-sensing display of embodiments 17 or 18, wherein the flexible polymer-containing substrate is a polyimide-containing substrate.

Embodiment 20: The touch-sensing display of any one or more of embodiments 15 to 19, wherein the display is a curved display, a curvilinear display, a foldable display, or a flexible display.

The laminates, methods, and displays can alternatively comprise, consist of, or consist essentially of, any appropriate components or steps herein disclosed. The laminates, methods, and displays can additionally, or alternatively, be formulated so as to be devoid, or substantially free, of any steps, components, materials, ingredients, adjuvants, or species that are otherwise not necessary to the achievement of the function or objectives of the compositions, methods, and articles.

All ranges disclosed herein are inclusive of the endpoints, and the endpoints are independently combinable with each other. "Combinations" is inclusive of blends, mixtures, alloys, reaction products, and the like. The terms "first," "second," and the like, do not denote any order, quantity, or importance, but rather are used to distinguish one element from another. The terms "a" and "an" and "the" do not denote a limitation of quantity, and are to be construed to cover both the singular and the plural, unless otherwise indicated herein or clearly contradicted by context. "Or" means "and/or" unless clearly stated otherwise. Reference throughout the specification to "some embodiments", "an embodiment", and so forth, means that a particular element described in connection with the embodiment is included in at least one embodiment described herein, and may or may not be present in other embodiments. In addition, it is to be understood that the described elements may be combined in any suitable manner in the various embodiments.

Unless defined otherwise, technical and scientific terms used herein have the same meaning as is commonly understood by one of skill in the art to which this application belongs. All cited patents, patent applications, and other references are incorporated herein by reference in their entirety. However, if a term in the present application contradicts or conflicts with a term in the incorporated reference, the term from the present application takes precedence over the conflicting term from the incorporated reference.

The term "alkyl" means a branched or straight chain, unsaturated aliphatic hydrocarbon group, e.g., methyl, ethyl, n-propyl, i-propyl, n-butyl, s-butyl, t-butyl, n-pentyl, s-pentyl, and n- and s-hexyl. "Alkenyl" means a straight or branched chain, monovalent hydrocarbon group having at least one carbon-carbon double bond (e.g., ethenyl (—HC=$CH_2$)). "Alkoxy" means an alkyl group that is linked via an oxygen (i.e., alkyl-O—), for example methoxy, ethoxy, and sec-butyloxy groups. "Alkylene" means a straight or branched chain, saturated, divalent aliphatic hydrocarbon group (e.g., methylene (—$CH_2$—) or, propylene (—$(CH_2)_3$—)). "Cycloalkylene" means a divalent cyclic alkylene group, —$C_nH_{2n-x}$, wherein x is the number of hydrogens replaced by cyclization(s). "Cycloalkenyl" means a monovalent group having one or more rings and one or more carbon-carbon double bonds in the ring, wherein all ring members are carbon (e.g., cyclopentyl and cyclohexyl). "Aryl" means an aromatic hydrocarbon group containing the specified number of carbon atoms, such as phenyl, tropone, indanyl, or naphthyl. The prefix "halo" means a group or compound including one more of a fluoro, chloro, bromo, or iodo substituent. A combination of different halo groups (e.g., bromo and fluoro), or only chloro groups can be present. The prefix "hetero" means that the compound or group includes at least one ring member that is a heteroatom (e.g., 1, 2, or 3 heteroatom(s)), wherein the heteroatom(s) is each independently N, O, S, Si, or P. "Substituted" means that the compound or group is substituted with at least one (e.g., 1, 2, 3, or 4) substituents that can each independently be a $C_{1-9}$ alkoxy, a $C_{1-9}$ haloalkoxy, a nitro (—$NO_2$), a cyano (—CN), a $C_{1-6}$ alkyl sulfonyl (—S(=O)$_2$-alkyl), a $C_{6-12}$ aryl sulfonyl (—S(=O)$_2$-aryl)a thiol ('SH), a thiocyano (—SCN), a tosyl($CH_3C_6H_4SO_2$—), a $C_{3-12}$ cycloalkyl, a $C_{2-12}$ alkenyl, a $C_{5-12}$ cycloalkenyl, a $C_{6-12}$ aryl, a $C_{7-13}$ arylalkylene, a $C_{4-12}$ heterocycloalkyl, and a $C_{3-12}$ heteroaryl instead of hydrogen, provided that the substituted atom's normal valence is not exceeded. The number of carbon atoms indicated in a group is exclusive of any substituents. For example—$CH_2CH_2CN$ is a $C_2$ alkyl group substituted with a nitrile.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A barrier film laminate (10) for a touch-sensing display, the laminate comprising
    a barrier layer (1) having a first surface (2) and a second surface (3) opposite the first surface;
    an optically clear adhesive layer (4) disposed on the first surface of the barrier layer, wherein a 50 micrometer-thick sample of the optically clear adhesive transmits greater than 85% of visible light as determined according to ASTM D1003-00;
    an optically clear polymer film (5) disposed on the optically clear adhesive on a side opposite the barrier layer, the polymer film comprising a thermoplastic polymer, wherein a 100 micrometer-thick sample of the optically clear polymer film transmits greater than 85% of visible light as determined according to ASTM D1003-00; and
    a touch-sensing layer (6) directly on the polymer film on a side opposite the optically clear adhesive layer, wherein a 5 micrometer-thick sample of the touch-sensing layer transmits greater than 80% of visible light as determined according to ASTM D1003-00.

2. The barrier film laminate of claim 1, wherein the barrier film laminate
    transmits greater than 85% of visible light as determined according to ASTM D1003-00;
    is flexible; or
    has a water vapor transmission rate of $10^{-6}$ to $10^{-3}$ g/m$^2$ per day, as determined according to ASTM F1249-06.

3. The barrier film laminate of claim 1,
    wherein the barrier layer has a thickness of 50 micrometers to 1 millimeter;
    wherein the optically clear adhesive has a thickness of 1 to 2000 micrometers; and
    wherein the polymer film has a thickness of 1 micrometer to 10 millimeters.

4. The barrier film laminate of claim 1, wherein the barrier layer is a glass layer comprising chemically strengthened glass, non-strengthened glass, tempered glass, or optically transparent synthetic crystal; and wherein the optically clear adhesive layer comprises an epoxy, acrylate, amine, urethane, silicone, thermoplastic urethane, ethyl vinyl acetate, hindered amine light stabilizer free ethyl vinyl acetate, or a combination comprising at least one of the foregoing.

5. The barrier film laminate of claim 1, wherein the barrier layer is a barrier film comprising two or more thin films comprising different materials.

6. The barrier film laminate of claim 1, wherein the polymer film comprises a polycarbonate, a polyester, a polyolefin, or a combination comprising at least one of the foregoing, preferably a bisphenol A polycarbonate homopolymer, a bisphenol A polycarbonate copolymer, poly(ethylene terephthalate), poly(ethylene naphthalate), polypropylene, or a combination comprising at least one of the foregoing.

7. The barrier film laminate of claim 1, wherein the touch-sensing layer is a capacitive touch-sensing layer.

8. The barrier film laminate of claim 1, wherein the touch-sensing layer comprises indium tin oxide, carbon nanotubes, graphene, conductive metal nanowires, conductive metal nanoparticles, a conductive nanomesh, a conductive polymer or a combination comprising at least one of the foregoing, preferably silver nanoparticles, silver nanowires, carbon nanotubes, graphene, a conductive polymer, or a combination comprising at least one of the foregoing.

9. A method of manufacturing a barrier film laminate for a touch-sensing display, the laminate comprising a barrier layer (1) have a first surface (2) and a second surface (3) opposite the first surface; an optically clear adhesive layer (4) disposed on the first surface of the barrier layer, wherein a 50 micrometer thick sample of the optically clear adhesive transmits greater than 85% of visible light as determined according to ASTM D1003-00; an optically clear polymer film (5) disposed on the optically clear adhesive on a side opposite the barrier layer, the polymer film comprising a thermoplastic polymer, where a 100 micrometer-thick sample of the optically clear polymer film transmits greater than 85% of visible light as determined according to ASTM D10003-00; and a touch sensing later (6) directly on the polymer film on a side opposite the optically clear adhesive layer, wherein a 5 micrometer-thick sample of the touch-sensing layer transmits greater than 80% of visible light as determined according to ASTM D1003-00, the method comprising:
    applying the touch-sensing layer directly to the polymer film;
    applying the optically clear adhesive to at least a portion of the first surface of the barrier layer; and
    applying the polymer film to the optically clear adhesive on a side opposite the touch-sensing layer.

10. A touch-sensing display comprising the barrier film laminate of claim 1.

11. The touch-sensing display (20) of claim 10, wherein the barrier film laminate (10) is disposed between a light emitting layer (21) and a polarizer (22) such that the second surface of the barrier layer of the barrier film laminate is in contact with the light emitting layer and the touch-sensing layer of the barrier film laminate is in contact with the polarizer.

12. The touch-sensing display of claim 10, further comprising
    a thin film transistor (23) disposed on the light emitting layer (21);
    a flexible polymer-containing substrate (24) disposed on the thin film transistor (23) on a side opposite the light emitting layer; and a cover lens (25) adhered to the polarizer on a side opposite the touch-sensing barrier layer via a second optically clear adhesive layer (26).

13. The touch-sensing display of claim 10, wherein the display is an organic light emitting diode display and the light emitting layer is an organic light emitting layer.

14. The touch-sensing display of claim 12, wherein the flexible polymer-containing substrate is a polyimide-containing substrate.

15. The touch-sensing display of claim 10, wherein the display is a curved display, a curvilinear display, a foldable display, or a flexible display.

\* \* \* \* \*